United States Patent [19]

Lam

[11] Patent Number: 5,216,806
[45] Date of Patent: Jun. 8, 1993

[54] METHOD OF FORMING A CHIP PACKAGE AND PACKAGE INTERCONNECTS

[75] Inventor: Ken Lam, Colorado Springs, Colo.

[73] Assignee: Atmel Corporation, San Jose, Calif.

[21] Appl. No.: 939,319

[22] Filed: Sep. 1, 1992

[51] Int. Cl.$^5$ ............................................. H05K 1/16
[52] U.S. Cl. ..................................... 29/848; 29/827;
    29/840; 174/52.4; 206/332; 361/404
[58] Field of Search ....................... 206/332; 174/52.4;
    29/840, 848, 827; 257/668; 361/404

[56] References Cited

U.S. PATENT DOCUMENTS

| | | | |
|---|---|---|---|
| 3,679,941 | 7/1972 | La Combe | 257/668 |
| 3,757,175 | 9/1973 | Sookim et al. | 257/688 |
| 4,300,153 | 11/1981 | Hayakawa et al. | 257/668 |
| 4,371,912 | 2/1983 | Guzik | 29/840 X |
| 4,426,773 | 1/1984 | Hargis | 29/832 |
| 4,866,507 | 9/1989 | Jacobs et al. | |
| 4,866,508 | 9/1989 | Eichelberger et al. | |
| 4,918,811 | 4/1990 | Eichelberger et al. | 29/840 |
| 4,979,289 | 12/1990 | Dunaway et al. | 29/827 X |
| 5,018,002 | 5/1991 | Neugebauer et al. | |

*Primary Examiner*—Carl J. Arbes
*Attorney, Agent, or Firm*—Schneck & McHugh

[57] ABSTRACT

A method of packaging an integrated circuit chip having an active surface with a pattern of input/output pads. A package member is positioned to frame the integrated circuit chip, leaving a gap between the active chip surface and an interconnect support surface of the package member. A filler material is deposited within the gap, simultaneously fixing the chip to the package member and providing a bridge that is coplanar with the active and interconnect support surfaces. A pattern of conductive printed circuit interconnects is preferably photolithographically formed from the input/output pads to an edge of the package member. The resulting structure can then be electrically connected to a substrate, such as a printed circuit board, by bonding the interconnects to contact sites on the substrate. Optionally, a number of integrated circuit chips can be connected to a single package member to form a multi-chip module.

22 Claims, 4 Drawing Sheets

METHOD OF FORMING A CHIP PACKAGE AND PACKAGE INTERCONNECTS

TECHNICAL FIELD

The present invention relates generally to integrated circuit chip packages and more particularly to interconnecting a chip package to a supporting substrate, such as a printed circuit board.

BACKGROUND ART

In electrically connecting an integrated circuit chip to a printed circuit board or the like, there are typically two levels of interconnection. In the first level, the integrated circuit chip is connected to a chip package. Common techniques for achieving this first level chip-to-package interconnection include wire bonding, flip-chip processing and lead frame connection. The second level of interconnection provides electrical connection of the chip package to the printed circuit board.

Package designers face serious challenges as the circuit density of a given size integrated circuit chip increases. The circuit density of a particular chip often plays a major role in the number of input/output signal pads on an active surface of a chip. An increase in the input/output count affects a number of factors which must be considered by package designers.

Firstly, a high input/output count requires a correspondingly high interconnection density, with respect to both the first and second levels of interconnection. A dense interconnect scheme is susceptible to electrical shorts. A second factor follows from the first. An integrated circuit chip having a dense interconnect scheme is typically associated with a relatively low manufacturing yield. Thus, a desirable package design is one which allows a high density of electrical paths that can be repeatedly and reliably isolated.

Using wire bonding techniques, the first level of interconnection is achieved by bonding individual bond wires from input/output pads on an integrated circuit chip to contact sites on a chip package. Even with the aid of robotics, the attachment of bond wires to input/output pads and to contact sites is a time consuming process that is susceptible to error The use of lead frames, such as a tape automated bonding lead frame, in which each lead is mechanically coupled to adjacent leads provides an alternative. However, high density lead frames have extremely thin leads that are susceptible to being bent during connection between a chip and a chip package.

It is an object of the present invention to provide a method of packaging an integrated circuit chip having a high density, high yield interconnection scheme.

SUMMARY OF THE INVENTION

The above object has been met by a method in which standard trace-forming techniques can be used to pattern signal lines that function in the dual roles of achieving first level interconnection, i.e., chip-to-package interconnection, and act as contact sites for second level interconnection, i.e. package-to-substrate interconnection. A package member is used to frame an active surface of an integrated circuit chip and to provide a support surface that is coplanar with the active surface. A filler material bridges the gap between the active surface and the support surface, so that the traces can be photolithographically formed from input/output pads on the active surface to an outer periphery of the support surface.

The package member is positioned on a support member and is secured in position by vacuum pressure. The integrated circuit chip is positioned on the support member and is precisely aligned within the package member. Vacuum pressure also secures the chip to the support member. A gap between the package member and the chip is bridged by depositing the filler material within the gap. Preferably, the active surface of the integrated circuit chip is placed against the support member during bridging of the gap, so that the active surface, the deposited filler material and the surface of the package member are coplanar.

The filler material bonds the integrated circuit chip to the package member. The resulting structure can then be removed from the support member. In a preferred embodiment, the traces that act as the first level interconnects are photolithographically etched directly onto the chip, filler material and package member. As alternatives to the preferred method of photolithographically forming the traces, (1) direct metal sputter deposition can be employed using a mask or (2) conductive organic material may be deposited using screening or manual painting techniques. However, these alternatives provide limitations with regard to trace density. Optionally, an insulator film may be deposited prior to formation of the interconnect traces.

Photolithographically forming the pattern of first level interconnects may include vacuum depositing a metallic film on the chip package and the active surface of the chip. Photolithographic techniques have advanced to the point at which masking and deposition steps provide thin film interconnects that allow the present invention to be used with high density integrated circuit chips. Preferably, the interconnects that are formed extend to the outer edge of the chip package. Optionally, the interconnects can extend downwardly along a lateral side of the package member. However, interconnects that do not reach the outer edge are also contemplated.

An advantage of the present invention is that thin film photolithographic techniques can be used to produce high density packages without the need of bonding or soldering interconnects from a chip to a package. The method is cost-efficient and adapts well to the automation of process steps.

Another advantage is that by framing the integrated circuit chip, the method provides protection in handling the chips The protection is particularly important in handling fragile gallium arsenide chips. Yet another advantage is that in a preferred embodiment the passive major surface of the chip is left unexposed, allowing use of a wide range of techniques for cooling the packaged chip. Moreover, the method may also be used in fabricating multi-chip packages, with some of the photolithographically patterned interconnects extending between chips within the same package. The photolithographically formed interconnects and the use of the filler material to bond individual chips to the multi-chip package facilitate reworking the package.

BEST MODE FOR CARRYING OUT THE INVENTION

Figure 1:
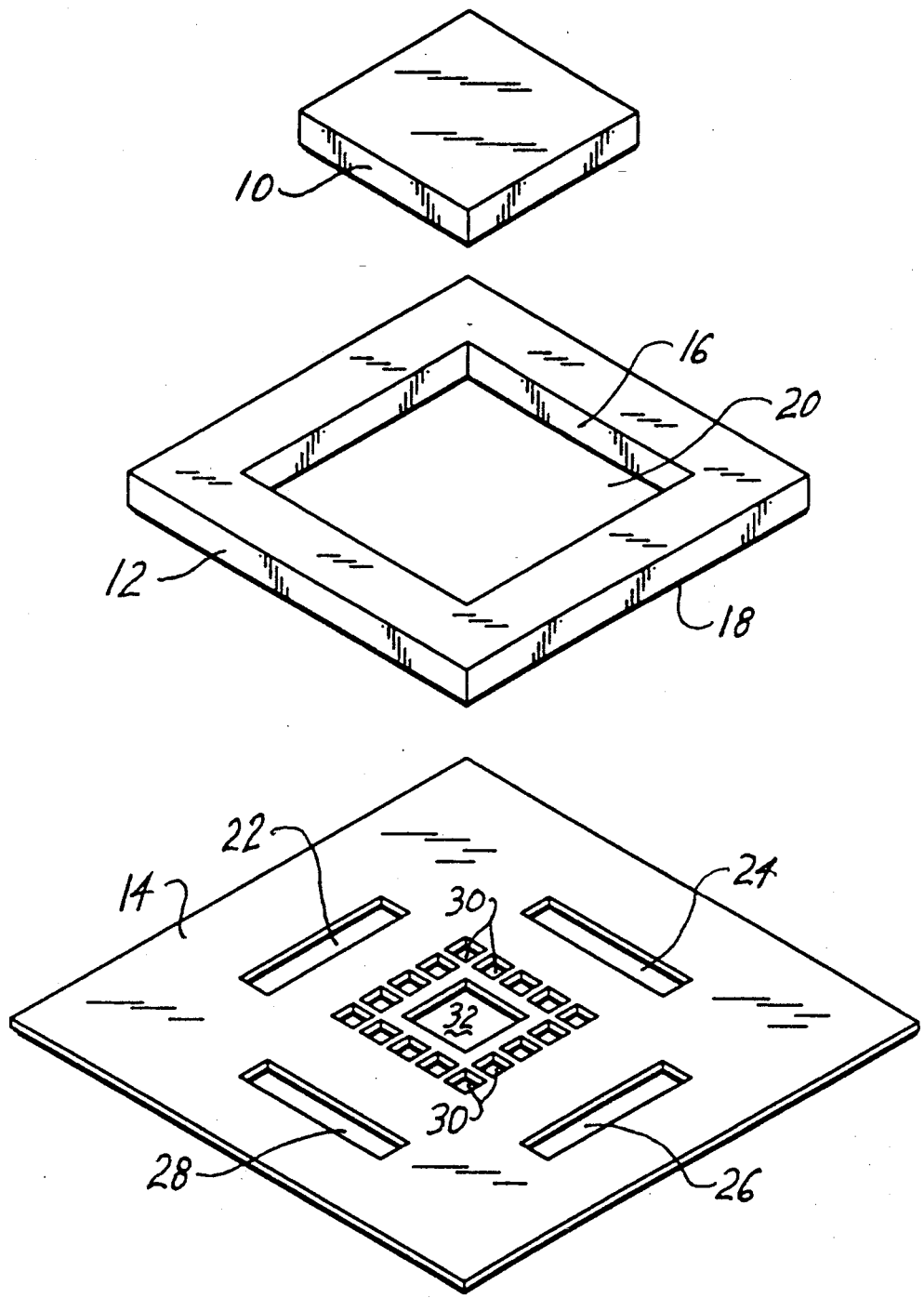
FIG. 1 is an exploded perspective view of an integrated circuit chip, a package member and a support member.

With reference to FIG. 1, an integrated circuit chip 10 is shown suspended above a package member 12 and a support member 14. The integrated circuit chip may be a memory chip, but this is not critical. The chip includes a pattern of input/output pads on an active surface, not shown, for supplying power to the chip and for conducting signals to and from the chip.

The package member 12 has an inner periphery 16 and a lower interconnect support surface 18. The height of the inner periphery is approximately equal to the height of the chip 10. A central opening 20 within the package member has length and width dimensions that are greater than those of the chip, so that the chip can be placed within the package member without contacting the inner periphery.

The package member 12 is made of a material that is compatible with metal vacuum deposition processing. Typically, the material is a dielectric, such as a ceramic, glass or plastic member, but may be a metal if an insulator is used to coat the metal prior to deposition of interconnects that will be described below. The interconnect support surface 18 should have a high degree of flatness.

The support member 14 includes four vacuum slots 22, 24, 26 and 28, a pattern of alignment openings 30 and a center vacuum opening 32. The alignment openings 30 are used to precisely position the integrated circuit chip 10 by alignment with input/output pads on the active surface of the chip. This can be substituted by use of a support member 14 that is transparent and that includes emulsion features in place of the alignment opening.

Figure 2:
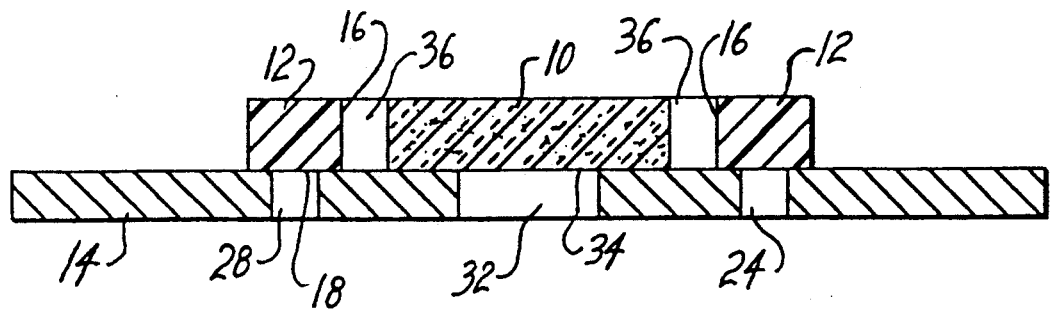
FIG. 2 is a side sectional view of the assembled members of FIG.

Referring now to FIGS. 1 and 2, the vacuum slots 22-28 are positioned such that the four sides of the package member 12 are each able to rest atop a vacuum slot. When the package member 12 and the integrated circuit chip 10 are rested on the support member 14, the vacuum slots provide an opening to the interconnect support surface 18 of the package member and the center vacuum opening 32 exposes a portion of the active surface 34 of the chip. Typically, the support member 14 is coated with an antistick substance, such as a high temperature silicone oil or the synthetic resin polymer sold under the trademark TEFLON.

The alignment openings 30 and the support member 14 have the same pattern as input/output pads, not shown, on the active surface 34 of the integrated circuit chip 10. The chip is precisely aligned on the support member by taking advantage of the correspondence between the input/output pads and the alignment openings. For example, an optical alignment device can be positioned below the support member 14 and proper positioning of the chip can be verified by monitoring the reflection from the chip. The metallic input/output pads reflect a greater amount of light energy than the remainder of the active surface 34 of the chip. While the support member is illustrated as having a one-to-one correspondence of alignment openings 30 to the input/output pads of the chip, this is not necessary. Alternatively, the support member may be limited to alignment openings that correspond to only the corner input/output pads or to other features of the chip. In fact, methods of aligning the chip without use of alignment openings may be used. One alternative alignment method would be to employ the emulsion features on a transparent support member as previously described. Other methods would be to employ standard photomask alignment techniques as in wafer fabrication or to provide custom alignment features on the support member for each specific application.

A first step in assembling the structure illustrated in FIG. 2 is to properly position the package member 12 over the vacuum slots 22-28. A first vacuum source which is in communication with the vacuum slots is then activated to secure the package member in the proper position above the support member 14. The next step is to align the integrated circuit chip 10 using the emulsion features on a transparent support member or alternatively using the alignment openings 30. A second vacuum source is then activated to create a negative pressure at the center vacuum opening 32, thereby securing the chip to the support member.

When the chip 10 and package member 12 are properly positioned, the inner periphery 16 of the support member is spaced apart from the integrated circuit chip by a gap 36. The width of the gap is not critical. Conventional deposition techniques are then used to fill the gap 36 with a high temperature material such as a nonconductive glass paste or polyimide.

Figure 3:
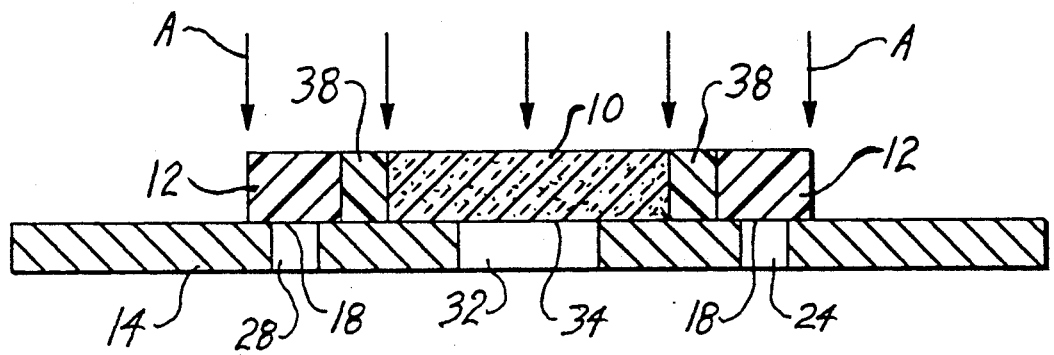
FIG. 3 is a side sectional view of the assembly of FIG. 2 having a filler material within a gap between the integrated circuit chip and the package member.

Referring now to FIG. 3, the filler material 38 that is deposited between the chip 10 and the package member 12 bonds the chip to the package member. While the upper surface of the resulting chip package is shown as being planar, deposition can be terminated before the entire gap between the chip and the package member is filled. That is, the passive side of the chip package does not need to be planar. However, the active side, which includes the interconnect support surface 18, the active surface 34 and the filler material 38, should be a planar side.

The filler material 38 is then cured. This can be accomplished by directing thermal energy downwardly onto the assembly, as indicated by arrows A. For example, the assembly may be introduced into a furnace that is conventionally used in wafer fabrication. An alternative is to use a material that can be cured by ultraviolet light. Yet another alternative is to use a filler material that is self-catalyzing, so that curing can occur by the introduction of a promoter solution.

Figure 4:
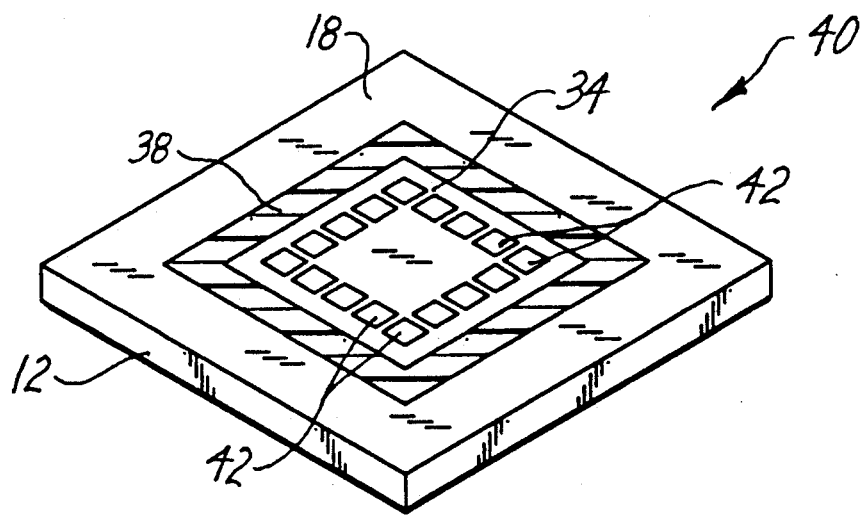
FIG. 4 is a perspective view of a chip package formed using the technique of FIG. 3.

The first and second sources of vacuum are deactivated to release the chip package 40 shown in FIG. 4. The chip package is shown in an inverted position relative to the illustrations described above. The upper side of the chip package 40 is the active side and is comprised of the interconnect support surface 18 of the package member 12, the active surface 34 of the integrated circuit chip, and the filler material 38 that bridges the gap between the interconnect support surface and the active surface. An array of input/output pads 42 are shown. Typically, the pads are more numerous than in the array illustrated in FIG. 4. For example, an array of 512 pads on a single integrated circuit chip is known. However, the density of pads on the chip package 40 has been reduced for purposes of illustration.

In electrically connecting the chip package 40 to a printed circuit board or the like, the input/output pads 42 must be electrically connected to the printed circuit board. Prior art chip packages often include contact sites at the outer periphery of the package member. The electrical contact between the contact sites and the input/output pads in these prior art chip packages is provided by individual bond wires or by a lead frame. However, as shown in FIG. 4, the chip package 40 does not include contact sites at the outer periphery. Rather, the present invention preferably includes using standard thin-film processing and photolithographic techniques to provide interconnects for conducting signals to and from the input/output pads. Photolithographic techniques allow a high density array of interconnects. Where density is not a key factor, the interconnects may be formed by direct sputter deposition employing a mask (such as a moly-mask) or by screening or manually printing conductive organic materials.

Figure 5:
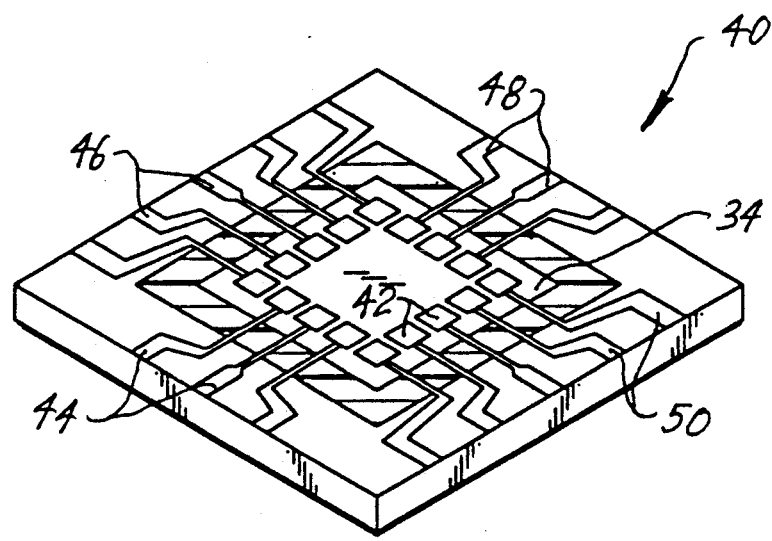
FIG. 5 is a perspective view of the chip package of FIG. 4 having photolithographically formed interconnects extending from input/output pads of the integrated circuit chip to an outer edge of the chip package.

Referring now to FIG. 5, metallic interconnects 44, 46, 48 and 50 are shown as extending from the input-/output pads 42 to the outer periphery of the chip package 40. A thin film of conductive material or materials, such as TiW-Au or Cr-Cu, can be deposited on the active side of the chip package. The conductive film may cover the entire side or may be limited to the area from the input/output pads to the outer periphery. Conventional masking and etching are then used to remove portions of the conductive film to isolate the interconnects 44-50. However, for gross geometries the preferred method is to vacuum deposit the interconnects, using a mask to cover those areas of the active side which do not receive interconnect film. That is, the areas between adjacent interconnects and the central region of the active surface 34 are covered by the mask.

The chip package 40 may then be inverted and connected to a printed circuit board, using the photolithographically formed interconnects 44-50 as contact sites to a corresponding array of contact sites on the printed circuit board. Surface mounting of the chip package to the board requires less board space, but the use of bond wires or a tape automated bonding frame or a regular metal lead frame may be used to provide electrical connection from the interconnects 44-50 to the board. Another interconnect approach would be to use a conductive elastomer to connect the signal traces to the printed circuit board.

Figure 6:
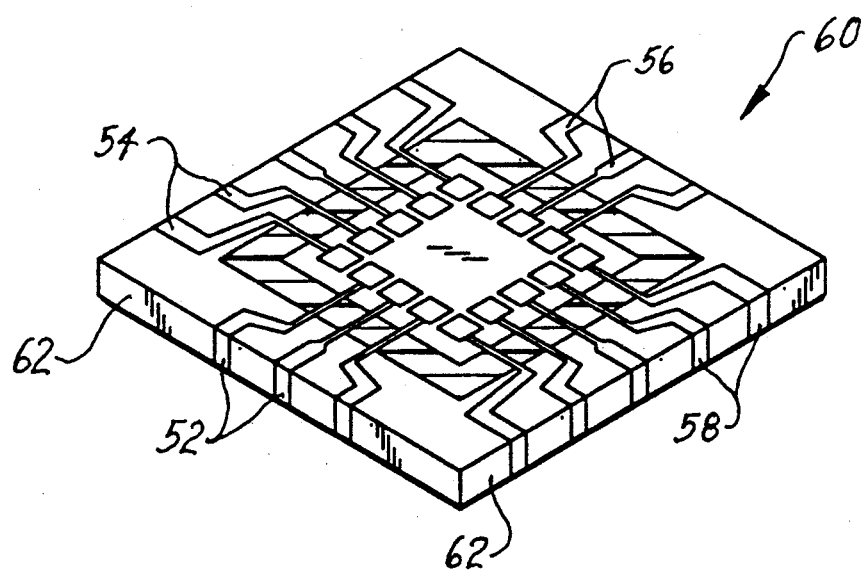
FIG. 6 is a perspective view of a second embodiment of photolithographically formed interconnects.

A second embodiment of the interconnect lines is shown in FIG. 6. In this embodiment, the metallic interconnects 52, 54, 56 and 58 of a chip package 60 extend along lateral edges 62 from the active side to the passive side of the chip package. A mask, not shown, having a cover surface and downwardly depending sides may be positioned over the chip package during vacuum deposition of the metallic interconnects 52-58. Slots that extend along the cover surface and continue down the lateral sides determine the position of the metallic interconnects. Following vacuum deposition, the mask is removed, leaving the chip package shown in FIG. 6. The formation of downwardly extending interconnects is described more fully in U.S. patent application Ser. No. 07/751,319, which is assigned to the assignee of the present invention and is incorporated herein by reference.

Figure 7:
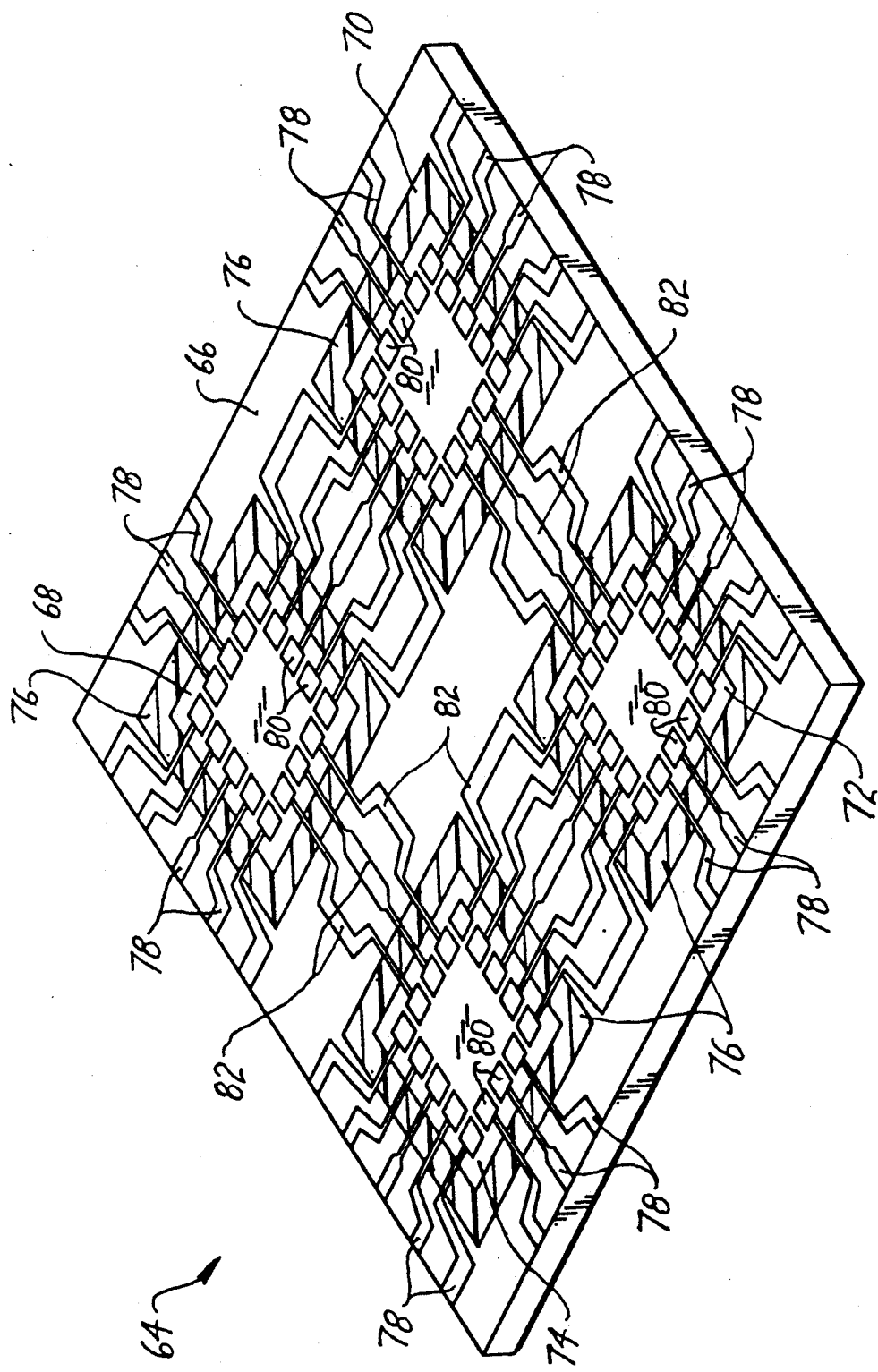
FIG. 7 is a perspective view of a multi-chip module fabricated using the processing steps of the present invention.

Referring now to FIG. 7, a multi-chip module 64 can be fabricated using the method described above. A single package member 66 includes a number of openings to receive a corresponding number of integrated circuit chips 68, 70, 72 and 74. The integrated circuit chips are secured in position relative to the package member, while filler material 76 is deposited into gaps between the package member and the chips. Thin film metallic interconnects 78 are then formed using standard photolithographic techniques, such as vacuum deposition, to conduct signals from input/output pads 80 to an edge of the module 64. Simultaneously, metallic interconnects 82 are formed to electrically connect input/output pads of one chip to those of another chip.

While the present invention has been described as having a single layer of interconnects on the active side of a chip package, multi-layered packages are also possible. An insulator polyimide material is blanket deposited onto the entire structure. Interconnect vias are then opened. A first layer of metallic interconnects is then formed. A second insulator layer, such as a polyimide layer, is deposited to electrically separate the first layer of metallic interconnects from a second layer of metallic interconnects which is subsequently formed. Preferably, the package member frames the integrated circuit chip, but in applications in which interconnects will not extend to all of the edges of the chip package, entirely surrounding the integrated circuit chip is not critical. Leaving one edge of the chip exposed may be desirable in some applications, such as one in which a liquid coolant is to contact the chip in order to conduct thermal energy away from the chip.

I claim:

1. A method of packaging an integrated circuit chip having an active surface having a pattern of chip input-/output pads comprising, providing a chip package member having a support surface, aligning said chip package member with said integrated circuit chip such that said active surface and said support surface are generally coplanar and are spaced apart by a gap, depositing filler material within said gap between said active and support surfaces, thereby fixing said integrated circuit chip to said chip package member with said active and support surfaces in generally coplanar alignment, and photolithographically forming a pattern of conductive printed circuit interconnects from said chip input/output pads and across said filler material to extend onto said support surface of said chip package member.

2. The method of claim 1 wherein said step of providing a chip package member is a step of providing a frame having an inner periphery, said step of aligning said package member including locating said integrated circuit chip within said inner periphery.

3. The method of claim 1 further comprising forming an insulator film on said support surface and on said filler material prior to said step of photolithographically forming said pattern of interconnects.

4. The method of claim 1 wherein said pattern of interconnects is formed directly onto said filler material and said active and support surfaces.

5. The method of claim 1 wherein said package member is a multi-chip module and wherein said method further comprises the step of aligning a plurality of integrated circuit chips within said multi-chip module.

6. The method of claim 5 wherein said step of aligning said integrated circuit chips includes leaving interior gaps between adjacent integrated circuit chips, said step of depositing said filler material including introducing said filler material into said interior gaps.

7. The method of claim 5 wherein said chip package member has a plurality of cells, said step of aligning said integrated circuit chips including locating an integrated circuit chip in each cell.

8. The method of claim 5 wherein said step of photolithographically forming said pattern of interconnects includes forming interconnects from a first integrated circuit chip to a second integrated circuit chip.

9. The method of claim 1 wherein said step of depositing said filler material is a step including deposition of an insulative material.

10. A method of packaging an integrated circuit chip having a plurality of chip input/output pads on an active surface comprising,
framing said chip with a chip package, including leaving a gap between said active surface and said chip package,
depositing a dielectric material within said gap, thereby bonding said chip package to said chip and forming a bridge from said chip input/output pads to an outer periphery of said chip package, and
forming a conductive layer on said dielectric material, active surface and said chip package, such that said conductive layer defines interconnects extending from said chip input/output pads to said outer periphery of said chip package.

11. The method of claim 10 wherein said step of depositing said dielectric material is a step of forming said bridge such that said bridge is generally coplanar with said active surface of said chip and with a surface of said chip package.

12. The method of claim 10 wherein said step of forming said conductive layer is a step of metal sputter deposition using a mask member.

13. The method of claim 10 wherein said step of forming said conductive layer is a step including vacuum depositing said conductive layer.

14. The method of claim 10 wherein said step of forming said conductive layer is of selectively depositing conductive organic material.

15. The method of claim 10 further comprising forming said interconnects such that said interconnects further extend along a lateral side of said chip package, said lateral side being perpendicular to said active surface of said chip.

16. The method of claim 10 further comprising vacuum securing said chip package and said chip to a support substrate during said step of depositing said dielectric material.

17. The method of claim 10 further comprising positioning a plurality of integrated circuit chips within said chip package.

18. A method of packaging an integrated circuit chip having a plurality of input/output pads on an active surface comprising,
providing a support member having means for securing a chip in a desired position relative to a chip package,
fixing said chip and said chip package to said support member such that said active surface faces said support member and such that said chip package has a first surface generally coplanar with said active surface,
forming a bridge between said active surface and said first surface of said chip package, thereby creating a packaged device having a planar active side that includes said active surface of said chip,
removing said packaged device from said support member, and
forming printed circuit interconnects along said active side from said input/output pads, across said bridge, to said chip package.

19. The method of claim 18 wherein said step of fixing said chip to said chip package is a step of applying vacuum pressure to said active surface of said chip and said first surface of said chip package.

20. The method of claim 19 further comprising aligning said input/output pads of said chip to a pattern of alignment features of said support member.

21. The method of claim 18 wherein said forming printed circuit interconnects is a step of photolithographically forming interconnects from said input/output pads to an outer periphery of said first surface of said chip package.

22. The method of claim 16 further comprising forming a dielectric layer on said active side of said packaged device prior to said step of photolithographically forming interconnects.

* * * * *